United States Patent [19]

Claeys et al.

[11] 4,203,765

[45] May 20, 1980

[54] ETCH BLEACHING LIQUID WITH IRON(III)IONS

[75] Inventors: Daniël A. Claeys, Mortsel; Albert A. Reyniers, Kontich; Wilhelmus Janssens, Aarschot, all of Belgium

[73] Assignee: AGFA-GEVAERT N.V., Mortsel, Belgium

[21] Appl. No.: 911,484

[22] Filed: Jun. 1, 1978

[30] Foreign Application Priority Data

Jun. 1, 1977 [GB] United Kingdom ............... 23204/77

[51] Int. Cl.² .......................... G03C 7/00; G03C 5/32
[52] U.S. Cl. .................................... 430/252; 252/186; 252/399; 423/272; 430/204; 430/302; 430/418; 430/430
[58] Field of Search ..................... 96/36, 60 R, 292, 3; 423/272; 252/186, 399

[56] References Cited

U.S. PATENT DOCUMENTS

| | | | |
|---|---|---|---|
| 3,194,768 | 7/1965 | Lindner et al. ....................... | 252/186 |
| 3,877,938 | 4/1975 | Shinozaki et al. ............... | 96/60 R X |
| 3,933,982 | 1/1976 | Kushibe ................................ | 423/272 |
| 3,960,565 | 6/1976 | Fisch et al. ............................ | 96/60 R |
| 4,022,703 | 5/1977 | Bakes et al. ............................ | 252/100 |

*Primary Examiner*—Edward C. Kimlin
*Attorney, Agent, or Firm*—William J. Daniel

[57] ABSTRACT

An aqueous acidic etch-bleach solution comprising hydrogen peroxide, iron(III)ions and inorganic anions that form a silver salt having a solubility product not greater than $1 \times 10^{-8}$ determined in water at 20° C., characterized in that such solution contains in the dissolved state the combination of citric acid and a polymer containing alkylene oxide units for improved stabilization of the hydrogen peroxide.

10 Claims, No Drawings

ETCH BLEACHING LIQUID WITH IRON(III) IONS

This invention relates to ecologically acceptable etch-bleach solutions suitable for use in the so-called "etch-bleach" process.

It is known that gelatin relief images can be formed from a gelatin layer containing a developed silver image by treating the layer with hydrogen peroxide and metal ions of multiple valency in their higher oxidation state. The silver is oxidized to a silver salt and the hydrophilic colloid associated with the silver image is degraded so that it can be washed away. This process is commonly called the "etch-bleach" process and is described e.g. in U.S. Pat. Nos. 3,567,446 of John M. Gleadle issued Mar. 2, 1971 and 3,625,687 of Michael Patrick Dunkle issued Dec. 7, 1971, in the United Kingdom Pat. No. 1,222,415 filed July 3, 1968 by Kodak Ltd. and in J.Proc.Tech.Ass.Graphic Arts, 1967, p. 1–11.

The etch-bleach process has been used for the formation of coloured relief images useful in the graphic arts field and for the preparation of lithographic printing plates.

Known etch-bleach solutions suited for use in this process are acid solutions comprising hydrogen peroxide, copper(II), tin(IV) or iron(III) ions and anions forming insoluble silver salts, e.g., chloride ions.

An etch-bleach solution containing the above ingredients is prepared by mixing immediately before use an aqueous hydrogen peroxide solution with an acidic aqueous solution containing at least one of these metal ions in the higher oxidation state and at least one such anion. The reason for keeping these ingredients apart before use is the poor stability of the mixed solution, which rapidly loses its activity by hydrogen peroxide decomposition.

The introduction of copper(II) ions into waste waters is ecologically unacceptable. Tin(IV) ions do not cause a serious pollution problem but have a rather poor activity so that only iron(III) ions are left for practical use. Unfortunately iron(III) ions have a greater effect on hydrogen peroxide decomposition than even copper(II) ions.

The acids which can be used include, for example, citric acid, acetic acid, salicylic acid, tartaric acid, phosphoric acid, formic acid, nitric acid and hydrochloric acid. From these acids citric acid and acetic acid are ecologically acceptable but although giving acceptable stability to copper(II) ion containing hydrogen peroxide baths their stabilizing activity as sole stabilizing agent fails in the presence of iron(III) ions.

From the published German Pat No. (Auslegeschrift) 1,177,115 filed July 19, 1961 by Henkel & Co G.m.b.H. it is known to stabilize aqueous hydrogen peroxide solutions by the addition of polyoxyalkylene compounds. These polyoxyalkylene compounds which are used preferably in an amount of 1 to 8% by weight in the aqueous hydrogen peroxide solution are capable of effective stabilisation with cooper(II) ions but as has been established experimentally, fail when used as the sole $H_2O_2$-stabilizing agent in the presence of iron(III) ions.

In the U.S. Pat. No. 3,933,982 Kazuyoshi Kushibe issued Jan. 20, 1976 an acid aqueous solution of hydrogen peroxide containing copper ions capable of catalytically decomposing hydrogen peroxide is used in the presence of at least one glycol ether. The acids incorporated in that solution are nitric acid, sulphuric acid and phosphoric acid. It has been established experimentally that in the presence of iron(III) ions, nitric acid and sulphuric acid are not effective stabilisers for hydrogen peroxide. Phosphoric acid showed in these circumstances an interesting stabilizing action but is ecologically unacceptable.

It has now been found that the combination of citric acid and alkylene oxide polymers shows a superadditive stabilizing effect with respect to acidic aqueous hydrogen peroxide solutions that contain iron(III) ions and anions capable of forming insoluble silver salts e.g. chloride ions.

The present invention provides an aqueous acidic etch-bleach solution comprising hydrogen peroxide, iron(III) ions and inorganic anions, which form an insoluble silver salt as defined hereinafter, characterized in that it contains in the dissolved state the combination of citric acid and a polymer containing alkylene oxide units for improved stabilization of the hydrogen peroxide.

Particularly useful for the purpose of the present invention are polymers containing ethylene oxide units and/or propylene oxide units. These polymers have preferably a structure and molecular weight that allow their incorporation in dissolved state at 20° C. for at least 0.1% by weight into an acidic aqueous liquid having a pH in the range of 1 to 5.

Alkylene oxide polymers that are preferably applied in the present etching solution are polyoxyethyleneglycols having a molecular weight in the range of 200 to 3000 wherein one or both of the terminal hydroxyl groups may have been converted into ether groups e.g. forming polyethylene glycol monomethyl ethers. Polymers containing a plurality of alkylene oxide units are described, e.g., in U.S. Pat. Nos. 1,970,578 of Conrad Schoeller and Max Wittner issued Aug. 21, 1934, 2,240,472 of Donald R. Swan issued Apr. 29, 1941, 2,423,549 of Ralph Kinsley Blake, William Alexander Stanton and Ferdinand Schulze issued July 8, 1947, 2,441,389 of Ralph Kinsley Blake issued May 11, 1948, 2,531,832 of William Alexander Stanton issued Nov. 28, 1950, 2,533,990 of Ralph Kinsley Blake issued Dec. 12, 1950, 5,523,796 of Jozef Frans Willems, Francis Jeanne Sels and Robrecht Julius Thiers issued Aug. 11, 1970, 3,523,797 of Jozef Frans Willems, Francis Jeanne Sels and Robrecht Julius Thiers issued Aug. 11, 1970, 3,552,968 of Jozef Frans Willems issued Jan. 5, 1971, 3,746,545 of Robert Joseph Pollet, Jozef Frans Willems, Francis Jeanne Sels and Herman Adelbert Phillippaerts issued July 17, 1973, 3,749,574 of Robert Joseph Pollet, Francis Jeanne Sels and Herman Adelbert Philippaerts issued July 31, 1973, in the United Kingdom Pat. Nos. 600,058 filed Jan. 10, 1946 by E. I. du Pont de Nemours, 871,801 filed Nov. 30, 1956 by Kodak, 920,637 filed May 7, 1959, 940,051 filed Nov. 1, 1961, 945,340 filed Oct. 23, 1961, 949,643 filed Nov. 2, 1961, all four by Gevaert Photo-Producten N.V., 991,608 filed June 14, 1961 by Kodak, 1,015,023 filed Dec. 24, 1961, 1,091,705 filed May 20, 1965, both by Gevaert Photo-Producten N.V., 1,107,022 filed Oct. 7, 1965, 1,147,817 filed Aug. 19, 1966, 1,162,135 filed Oct. 11, 1965 and 1,184,434 filed Aug. 30, 1966 all four by Gevaert-Agfa N.V., in the published German Patent Applications 1,141,531 filed Jan. 24, 1962 by Perutz Photowerke G.m.b.H., and 1,188,439 filed May 16, 1964 by Fuji Shashin Film Kabushiki Kaisha.

Many of these alkylene oxide polymers are actually condensation products of polyoxyalkylene glycols with aliphatic acids, e.g. carboxylic acids, their corresponding anhydrides, or partially esterified oxyacids of phosphorus. In the United Kingdom Pat. Nos. 920,637 filed May 7, 1959 by Gevaert Photo-Producten N.V. and 945.340 filed Oct. 23, 1961 by Gevaert Photo-Producten N.V. the preparation of compounds analogous to compounds 4 and 5 of Table I hereinafter is described.

Representative examples of polyoxyalkylene compounds suitable for use according to the invention are listed in the following Table I.

Table I

1. $HO-(CH_2-CH_2-O)_n-CH_2-CH_2-OH$
   (average molecular weight = 200)
2. $HO-(CH_2-CH_2-O)_n-CH_2-CH_2-OH$
   (average molecular weight = 2000)
3. $HO+CH_2-CH-O\!\!\!\!\!+_n\!CH_2-CH-OH$
            $|$              $|$
           $CH_3$            $CH_3$
   (average molecular weight = 2000)
4. $CH_3-(CH_2)_{15}-CH_2-COO-(CH_2-CH_2-O)_{40}-H$
5. $$H\!-\!\!\left[\!-O\!-\!\!\begin{array}{c}OC_2H_5\\|\\P\\\downarrow\\O\end{array}\!\!-(O-CH_2-CH_2)_n\!-\!\right]_n\!\!-OH$$
   (n is about 8)
6. ANTAROX CO-630 (tradename of Antara Chemicals, a Division of General Aniline & Film Corporation, New York, U.S.A. for:

[benzene ring with $H_{19}C_9$ substituent]—$O-(CH_2-CH_2-O)_{9-10}-H$

The "etch-bleach" solutions according to the present invention have a pH preferably in the range of 1 to 5 and comprise hydrogen peroxide preferably in a concentration of 0.01 to 5% by weight.

The concentration of the alkylene oxide copolymer in the etch-bleach solution of the present invention is preferably from 0.5 to 2.5% by weight. The amount of iron(III) salt that has been incorporated into said solution is preferably such that between 0.01 to 0.1 gram ions of iron(III) are present per litre. Any convenient iron(III) salt can be used to supply said ions; iron(III) nitrate and iron(III) chloride are particularly useful.

The anion which forms an insoluble silver salt and which is present in the etch-bleach solution of this invention is one capable of forming a silver salt having a solubility product not greater than $1 \times 10^{-8}$ determined in water at 20° C. Anions which are useful for that purpose are halide ions such as chloride and bromide.

The ion ratio between said anions and iron(III) cations is subject to variation and depends upon such things as the nature of the anions.

The inorganic anions that combine with the silver ions to form an insoluble silver salt as defined may be varied in order to obtain optimum results and the concentration of these ions in the etch-bleach solution is preferably maintained above about 0.05 gram ions per litre of solution. The anions forming silver salts can be incorporated as water-soluble salts, e.g. alkali metal or alkaline earth metal halide. Preferred salts are sodium chloride, calcium chloride and/or potassium bromide. The concentration of these salts is preferably such that the gram ion concentration of halide is between 0.1 and 0.4 gram ions per litre.

If necessary, acids other than citric acid can be used in minor amounts (at most 5% by weight) with respect to the total amount of acid e.g. to adjust the pH of the etch-bleach solution in the preferred range of 1 to 5 e.g. nitric acid, phosphoric acid, formic acid and hydrochloric acid, or for complexing iron(III) ions e.g. oxalic acid, phosphoric acid, hydrofluoric acid, salicylic acid and derivatives thereof such as sulfosalicyclic acid.

Gelatin softeners can be incorporated into the etch-bleach solution, particularly for use with hardened gelatin layers. Various softeners can be used including, e.g. salicyclic acid, citric acid, guanidine nitrate, guanidine hydrochloride and urea. In some instances, it may be desirable to use more than one gelatin softener such as a combination of citric acid and urea in which citric acid serves a multiple function in providing acidity to the solution, complexing of iron(III) ions as well as facilitating gelatin softening.

Hydrogen peroxide may be incorporated in the etch-bleach solution from an aqueous solution e.g. containing 30% by weight of hydrogen peroxide or according to a preferred embodiment as "urea peroxide" being an addition product of urea and hydrogen peroxide corresponding to the following formula $CO(NH_2)_2.H_2O_2$. It is a white, crystalline substance that is easily soluble in water and contains 34% by weight of $H_2O_2$ (see Hermann Römpp—Chemie Lexikon; Franckh'sche Verlagschandlung—Stuttgart, W. Germany; 5th ed. (1962) 2073).

In addition to directly added hydrogen peroxide as oxidizing agent water-soluble perborates and/or persulphates can be used. These can be in the form of ammonium or alkali metal perborates or sulphates yielding in situ hydrogen peroxide.

The etch-bleaching process according to the present invention contains the step of treating a photographically formed silver image in or on a hydrophilic polymeric colloid layer with the above defined etch-bleach solution.

The silver image subjected to etch-bleaching according to the process of this invention can be obtained in any desired manner, for example, by physical or chemical development of image-wise photoexposed silver halide-containing layers. The silver image may likewise be obtained through the silver halide complex diffusion transfer (DTR) process by transfer and development of complexed silver halide onto a non-light-sensitive receptor material containing a degradable hydrophilic colloid layer.

The DTR-process may be carried out with separate photo-sensitive silver halide materials and receptor materials or with a so-called integral receptor material containing the photosensitive silver halide emulsion layer and image receiving layer in water-permeable relationship on the same support. When such an integral material after image-wise exposure and development is subjected to the etch-bleach solution of the present invention the silver image containing portions of the developed silver halide emulsion layer as well as the silver image containing portions of the image receiving layer are degraded and removed. The non-silver containing areas of the uppermost of the two layers e.g. the silver halide emulsion layer are removed together with the underlying silver-containing areas of the undermost layer e.g. image-receiving layer so that only the non-silver containing areas of the undermost layer remain.

The photosensitive materials may contain as light-sensitive silver salts, e.g., silver chloride, silver bromide, silver iodide, silver chlorobromide, silver chloroiodide, silver bromoiodide, silver chlorobromoiodide or mixtures thereof.

The colloid layer carrying the silver image contains as hydrophilic degradable colloid preferably a proteinaceous colloid such as gelatin. In preparing photographic silver halide emulsion layers it is preferred to use gelatin as a sole binding agent for the silver halide, although other hydrophilic photographic binding agents of proteinaceous nature known to those skilled in the art may be used instead or in addition to gelatin.

In preparing hydrophilic image receiving layers for use in the DTR-process likewise preferably gelatin is used to incorporate therein or coat thereon developing nuclei. Other hydrophilic colloids such as hydrophilic cellulose derivatives and alginic acid may be used in conjunction with gelatin.

Information on the composition of the image-receiving layer for the receptor material useful in the DTR-process can be found in "Photographic Silver Halide Diffusion Processes" by André Rott and Edith Weyde—The Focal Press London and New York (1972) p. 50-65.

Development nuclei suited for use in the DTR-process are nickel sulphide nuclei though other development nuclei can be used as well, e.g. sulphides of heavy metals such as sulphides of antimony, bismuth, cadmium, cobalt, lead, silver, and zinc. Other suitable nuclei are formed by selenides, polyselenides, polysulphides, mercaptans and tin(II) halides. The complex salts of lead and zinc sulphides are active both alone and when mixed with thioacetamide, dithiobiuret and dithio-oxamide. Fogged silver halides can also be used as well as heavy metals themselves in colloidal form, preferably silver, gold, platinum, palladium, and mercury may be used.

The image-receiving layer may be hardened so as to improve its mechanical strength. Hardening agents for colloid layers include, e.g., formaldehyde, glyoxal, mucochloric acid, and chrome alum. Hardening may also be effected by incorporating a latent hardener in the colloid layer, whereby a hardener is released at the stage of applying the alkaline processing liquid.

For carrying out the silver complex diffusion transfer process it is common practice to incorporate the developing agents into the light-sensitive silver halide emulsion layer and/or the image-receiving layer, or other water-permeable layers adjacent thereto, as it has been described, e.g., in United Kingdom Pat. 1,093,177 filed Dec. 16, 1964, 1,000,115 filed Aug. 4, 1961, 1,012,476 filed Dec. 18, 1961, 1,042,477 filed June 17, 1963, 1,054,253 filed Aug. 6, 1963 all five by Gevaert Photo-Producten N.V. The processing liquid accordingly used in the development stage can be limited to a so-called alkaline activating liquid being a mere aqueous alkaline solution comprising no developing agent(s).

Suitable developing agents for the exposed silver halide are, e.g., hydroquinone and 1-phenyl-3-pyrazolidnone and p-monomethylaminophenol and combinations thereof. The development or activating liquid contains in the process for forming a silver image through the silver complex diffusion transfer process a silver halide solvent, e.g., a silver halide complexing compound such as an alkali metal or ammonium thiosulphate or thiocyanate, or ammonia. Alternatively or in addition such complexing compound may be present in the image-receiving layer.

The exposure of the light-sensitive material and the diffusion transfer proceed preferably with, or in the apparatus commercially available therefor and of which several types have been described in the already mentioned book of A. Rott and E. Weyde.

The formation of the silver image may proceed through any type of silver halide emulsion material, e.g. with one of the negative type or with one of the direct-positive type i.e. one in which the silver image on development is formed in the non-exposed areas.

In principle any direct-positive silver halide emulsion is suited, which in a simple development yields a positive silver image and a corresponding image-wise distribution of developing agent oxidation products. For example silver halide emulsions can be used wherein a developable fog has been produced by overall exposure or chemical treatment, the said fog being destroyed imagewise during the image-wise exposure.

In the unexposed areas the fog is maintained, so that a direct positive silver image is obtained during the subsequent development. In this connection reference is made, e.g., to the direct-positive photographic materials described in the United Kingdom Pat. 1,155,404 filed May 9, 1966 by Gevaert-Agfa N.V.

Another group of direct-positive silver halide emulsion materials comprises a so-called unfogged direct-positive silver halide emulsion, which has its sensitivity predominantly in the interior of the silver halide grains. Upon image-wise exposure of such emulsion a latent image forms predominantly in the interior of the silver halide grains. However, the development of such unfogged direct-positive silver halide emulsion is carried out under fogging conditions, wherein fog forms predominantly in the unexposed areas and a positive silver image results upon development. The unfogged, direct-positive silver halide emulsion material is characterized thereby that in the exposed parts no silver image is produced or only one of very poor density upon development by the use of a typical surface developer of the following composition:

p-hydroxyphenylglycine: 10
sodium carbonate-1-water: 100 g
water up to: 1000 ml, whereas a silver image with sufficient density forms if an internal type developer of the following composition is used:

hydroquinone: 15 g
monomethyl-p-eminophenol sulphate: 15 g
anhydrous sodium sulphite: 50 g
potassium bromide: 10 g
sodium hydroxide: 25 g
sodium thiosulphate-5-water: 20 g
water up to: 1000 ml.

The selective fogging of the image-wise exposed unfogged direct-positive emulsion materials can be carried out before or during development by a treatment with a fogging agent. Suitable fogging agents are reducing agents such as hydrazine or substituted hydrazine compounds. Reference may be made to U.S. Pat. No. 3,227,552 of Keith E. Whitmore issued Jan. 4, 1966.

Unfogged direct-positive emulsions are e.g. those showing defects in the interior of the silver halide grains (ref. U.S. Pat. No. 2,592,250 of Edward Phillip Davey and Edward Bowes Knott issued Apr. 8, 1952) or silver halide emulsions with covered-grain structure (ref. published German Patent Application 2,308,239 filed Feb. 20, 1973 by Agfa-Gevaert AG).

Depending on what the releif patterns are to be used for the support of the imaging material is transparent of opaque. So, it is possible to use metal layers or sheets, glass, ceramics, resin supports and paper.

In preparing a transparency by the etch-bleach process using the DTR-process the support of the receptor layer is preferably a transparent resin film support, e.g. a subbed polyethylene terephthalate support. Examples of such subbed film supports are described, e.g., in the United Kingdom Pat. 1,234,755 filed Sept. 28, 1967 by Agfa-Gevaert N.V.

In the etch-bleach process for producing an offset master the degradable colloid layer in which or whereon the photographic silver image is produced is preferably applied to a hydrophobic support, e.g. polyethylene terephthalate having an oleophilic coating as described, e.g., in the U.S. Pat. No. 3,625,687 of Michael Patrick Dunkle issued Dec. 7, 1971. By the treatment of the silver image with the present etch-bleach solution the colloid binder of said layer is degraded and removed, e.g., by rinsing with running tap-water hereby uncovering image-wise the oleophilic coating of the support.

In the etch-bleach process for producing a coloured print, e.g. for colour proofing purposes or as transparency suited for overhead projection, the colloid layer whereon or wherein the silver image is produced photographically contains one or more dyes or pigments.

When used in "colour proofing" the dyes of pigments have to match as close as possible with the absorption spectrum of the standard process inks. Particulars about standard colour inks can be found in H. M. Cartwright—Ilford Graphic Arts Manual (1962) Vol. I—p. 502–504.

There exist "cold" and "warm" colour standards. Cold colour tones are standarized e.g. in the U.S.A. in the GATF-Color Charts and in the German Standards DIN 16508 and 16509. Warm colour tones are standardized e.g. in the German Standard DIN 16538.

Pigments that are very poorly soluble or insoluble in water and organic liquids of the alcohol or polyhydric alcohol type, e.g. glycerol, are preferred for their resistance to diffusion. Pigment dyes that are applied from an aqueous dispersion are used preferably, though the use of substantive dyes that are chemically linked to the hydrophilic colloid or admixed polymer is not excluded. For colour proofing purposes the selectively degradable layer contains pigments in such concentration that the optical density in the wavelength range of maximum absorption is at least 0.35.

Apart from the use of dyes whose absorption spectrum has to satisfy particular requirements for colour proofing, all colours can be employed e.g. cyan, light cyan, magenta, warm magenta, black, yellow, green, brown, orange, red, white, blue as well as metallic colours such as pale gold, rich gold, copper, and silver. In other words wherever the term "colour" is used in the present description, it is meant to encompass all pure and mixed colours as well as black-and-white.

Non-migratory pigments suitable for use in gelatin-containing layers are known by the name "PIGMOSOL" and "COLANYL" dyes. "PIGMOSOL" and "COLANYL" are Trade Marks of Badische Anilin- & Soda-Fabrik AG, Ludwigshafen/Rh., W. Germany for organic pigment dyes that are mixed with a dispersing agent for aqueous medium. These pigment dyes excel in resistance to light, heat, acids, bases, oxidizing agents, and solvents. They are insoluble in hydrophilic colloids such as gelatin.

The black-pigment for the black-toned proofing image is preferably carbon black.

Instead of incorporating a dye in advance i.e. before the relief formation in the degradable colloid layer, a dye may be applied by soaking the developed hydrophilic colloid relief pattern in a dye solution. The dye may be fixed in the relief pattern with a mordanting agent to offer a stable colour print.

Instead of effecting the colouring by soaking or imbibition a desired colour can be applied in selected relief areas by means of a brush or porous pen (felt marker) provided with an aqueous ink. Easy pattern recognition by dyeing selected areas with a pen is obtained by producing first a white relief pattern starting with a colloid layer containing white pigment particles e.g. titanium dioxide. Dyeing in different colours with the pen of selected relief parts may find application in image composition work e.g. title-setting or other graphic art work.

According to an embodiment called the dye transfer process for producing multicolour prints, three positive reliefs corresponding multicolour prints, three positive reliefs corresponding respectively with the primary colour patterns of a multicolour original are soaked in dye solutions of the appropriate minus colour and squeegeed into contact with a paper coated with mordanted gelatin. Said paper is called the dye transfer matrix. The successive transfer, in register, of the three dye images gives a colour print. Matrices can, of course, be used to produce motion-picture films according to the Technicolor dye transfer process (ref.: The Science of Photography by H. Baines—Fountain Press—London (1958) p. 260).

According to a particularly preferred embodiment for producing positive colour prints from positive originals through the etch-bleach process the process comprises the steps of.

exposing a light-sensitive gelatin silver halide emulsion layer of the direct-positive type to a positive original, treating the exposed emulsion layer with an aqueous alkaline solution in the presence of a developing agent and a silver halide solvent, bringing said layer into effective contact with a coloured receptor layer containing gelatin and development nuclei or a substance capable of forming such nuclei, separating said layers after formation of a silver image on the receptor layer, treating the receptor layer carrying the silver image with the etch-bleach solution according to the present invention, and removing the degraded receptor layer portions leaving a positive colour image.

The present invention is illustrated by the following Examples. All parts, percentages and ratios are by weight unless otherwise stated.

EXAMPLE 1

Onto a polyethylene terephthalate support having a thickness of 0.1 mm and provided with a subbing layer for adhering thereto a hydrophilic colloid layer a coloured image-receiving layer suited for use in the DTR-processing was coated from the following coating composition at a coverage of 30 g per sq.m:

| | |
|---|---|
| water | 880 g |
| gelatin | 45 g |
| aqueous dispersion of 0.20% of colloidal silver sulphide in a 2% aqueous gelatin solution | 20 g |
| LUCONYLBLAU LBGO (trade name of Badische Anilin- & Soda-Fabrik AG, Ludwigshafen/Rh., W. Germany, for a cyan pigment dispersion) | 11 g |
| 50% aqueous urea solution | 8.0 ml |
| 20% aqueous formaldehyde solution | 10.0 ml |
| 5% aqueous solution of  serving as coating aid | 16 g |

After drying, a silver image containing in the silver covered parts 0.5 g of silver per sq.m was formed onto the image-receiving layer through the DTR-process using a light-sensitive material comprising a direct-positive fogged silver halide emulsion layer that was exposed image-wise in a process camera to a halftone pattern.

The obtained silver image was used to test the etching power of the following etch-bleach solutions A to H after storage for several days at 20° C. as indicated in Table II. In Table II the etching power is expressed by the quality numbers 1, 2 and 3 in which 1 stands for sufficient activity, 2 for poor activity and 3 for insufficient activity. The etching time and etching temperature were the same in each test viz. 30 s and 22° C. respectively.

The etch-bleach solution A had the following composition:
water: 980 ml
calcium chloride: 10 g
iron(III)nitrate-9-water: 10 g
citric acid: 10 g
30% aqueous hydrogen peroxide solution: 100 ml The etch-bleach solutions B to D contained 20, 50 and 100 g respectively of citric acid instead of 10 g. The etch-bleach solution E contained 50 g of citric acid instead of 10 g and in addition thereto 10 g of polyoxyethyleneglycol having an average molecular weight of 2000. The etch-bleach solution F contained 10 g of critic acid and 10 g of said polyoxyethylene glycol. The etch-bleach solution G contained instead of citric acid nitric acid in an amount sufficient to reach a pH 1.2 and no polyoxyethylene glycol. The etch-bleach solution H was identical to solution G but contained in addition thereto 10 g of said polyoxyethylene glycol.

Table II

| Etch-bleach Solution | Etching power of etch-bleach solution after storage time (in days) | | | | |
|---|---|---|---|---|---|
| | 1 | 2 | 4 | 6 | 10 | 12 |
| A | 2 | 3 | 3 | 3 | 3 | 3 |
| B | 1 | 1 | 3 | 3 | 3 | 3 |
| C | 1 | 1 | 1 | 3 | 3 | 3 |
| D | 1 | 1 | 1 | 2 | 3 | 3 |
| E | 1 | 1 | 1 | 1 | 1 | 1 |
| F | 1 | 1 | 1 | 1 | 1 | 1 |
| G | 3 | 3 | 3 | 3 | 3 | 3 |
| H | 2 | 3 | 3 | 3 | 3 | 3 | quality numbers

EXAMPLE 2

Etch-bleach solutions containing the following ingredients:
hydrogen peroxide at the start: 21 to 23.5 g
iron(III)nitrate-9-water: 10 g
sodium chloride: 10 g
acid (see Table III):
polyoxyethylene glycol of Example 1 (see Table III);
water up to: 1 l
were tested with respect to stability in the absence or presence of polyoxyethylene glycol (average molecular weight 2000) as stabilizing agent. The hydrogen peroxide was added as $CO(NH_2)_2 \cdot H_2O_2$.

The solutions were stored at 30° C. Table III lists the hydrogen peroxide content per liter of solutions 1 to 6 as a function of storage time expressed in days.

Table III

| Etch-bleach solution no. | Acid added | Polyoxyethylene glycol amount in g | $H_2O_2$ content (g/l) | | |
|---|---|---|---|---|---|
| | | | after 1 day | after 2 days | after 3 days |
| 1 | citric acid 10 g | — | 19.8 | 0.7 | 0.2 |
| 2 | citric acid 10 g | 10 | 21.7 | 17.6 | 14.6 |
| 3 | citric acid 50 g | 10 | 20.6 | 1.8 | 17.8 |
| 4 | nitric acid to pH 1.2 | — | 0.1 | 0.05 | — |
| 5 | nitric acid to pH 1.2 | 10 | 18 | 1.4 | 0.1 |
| 6 | oxalic acid up to pH 1.2 | — | 20.1 | 20.8 | 20.7 |
| 7 | oxalic acid up to pH 1.2 | 10 | 21.9 | 21.5 | 21.4 |
| 8 | phosphoric acid up to pH 1.2 | — | 22.6 | 21.5 | 20.7 |
| 9 | phosphoric acid up to pH 1.2 | 10 | 23.2 | 23.2 | 21.8 |

We claim:
1. An etch-bleaching process containing the step of treating a hydrophilic polymeric colloid layer comprising a photographically formed silver image with an aqueous acidic etch-bleach solution comprising hydrogen peroxide, iron (III) ions and inorganic anions that form a silver salt having a solubility product not greater than $1 \times 10^{-8}$ determined in water at 20° C., characterized in that this solution contains in the dissolved state the combination of citric acid and a polymer containing alkylene oxide units, whereby improved stabilization of the hydrogen peroxide is obtained.

2. An etch-bleaching process according to claim 1, wherein the silver image has been obtained by the silver halide complex diffusion transfer process in an image receiving layer.

3. An etch-bleaching process according to claim 2, comprising the steps of exposing a light-sensitive gelatin silver halide emulsion layer of the direct-positive type to a positive original, treating the exposed emulsion layer with an aqueous alkaline solution in the presence of a developing agent and a silver halide solvent, bringing said layer into effective contact with a coloured receptor layer containing gelatin and development nuclei or a substance capable of forming such nuclei, separating said layers after formation of a silver image on the receptor layer, treating the receptor layer carrying the silver image with said etch-bleach solution, and removing the degraded receptor portions leaving a positive colour image.

4. A process according to claim 1, wherein said alkylene oxide units are ethylene oxide and/or propylene oxide units and said polymer is such as to dissolve at 20° C. in an amount of at least 0.1% by weight into an acidic aqueous solution having a pH in the range of 1 to 5.

5. A process according to claim 1, wherein said polymer is a polyoxyethylene glycol having an average molecular weight of 2,000.

6. A process according to claim 1, wherein said iron (III) ions are derived from iron (III) nitrate.

7. A process according to claim 1, wherein the inorganic anions are halide ions.

8. A process according to claim 1, wherein hydrogen peroxide is present in a concentration of 0.01 to 5% by weight.

9. A process according to claim 1, wherein the amount of iron (III) salt present in the solution is such to provide between 0.01 and 0.1 gram ions of iron (III) per liter.

10. A process according to claim 1, wherein the solution has a pH in the range of 1 to 5.

* * * * *